(12) United States Patent
Li

(10) Patent No.: US 11,508,758 B2
(45) Date of Patent: Nov. 22, 2022

(54) DISPLAY PANEL AND DISPLAY

(71) Applicant: WUHAN CHINA STAR OPTOELECTRONICS SEMICONDUCTOR DISPLAY TECHNOLOGY CO., LTD., Hubei (CN)

(72) Inventor: Xue Li, Wuhan (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 286 days.

(21) Appl. No.: 16/321,912

(22) PCT Filed: Nov. 20, 2018

(86) PCT No.: PCT/CN2018/116397
§ 371 (c)(1),
(2) Date: Jan. 30, 2019

(87) PCT Pub. No.: WO2020/073434
PCT Pub. Date: Apr. 16, 2020

(65) Prior Publication Data
US 2020/0119050 A1    Apr. 16, 2020

(30) Foreign Application Priority Data
Oct. 10, 2018 (CN) .......................... 201811175740.3

(51) Int. Cl.
*H01L 27/12* (2006.01)
*G09G 3/34* (2006.01)

(52) U.S. Cl.
CPC ............ *H01L 27/124* (2013.01); *G09G 3/34* (2013.01)

(58) Field of Classification Search
CPC ................................ H01L 27/124; G09G 3/34
See application file for complete search history.

(56) References Cited

U.S. PATENT DOCUMENTS

2008/0251787 A1    10/2008  Kim
2017/0123506 A1*   5/2017   Song ................. G02F 1/136286
2017/0184888 A1*   6/2017   Sakamoto ......... G02F 1/133308

FOREIGN PATENT DOCUMENTS

CN        1743926 A         3/2006
CN      102270413 A  *    12/2011   ............... G07F 9/30

(Continued)

*Primary Examiner* — Alexander G Ghyka
(74) *Attorney, Agent, or Firm* — PV IP PC; Wei Te Chung; Ude Lu

(57) ABSTRACT

The present disclosure discloses a display panel which includes a substrate and plurality of insulating layers disposed on the substrate, and a plurality of metal routings, and includes a display region and a first non-display region at left and right sides of the display region, and a display, the plurality of metal routings being at the first non-display region and insulated from each other, and at least adjacent two of the metal routings being positioned on different layers of the insulating layers. An interval between adjacent metal routings on different insulating layers in a horizontal direction can be reduced through the above wiring manner, thereby reducing a space occupied by the first non-display region.

13 Claims, 7 Drawing Sheets

(56) References Cited

FOREIGN PATENT DOCUMENTS

| | | | |
|---|---|---|---|
| CN | 102270413 A | 12/2011 | |
| CN | 105204248 A | 12/2015 | |
| CN | 106200080 A | 12/2016 | |
| CN | 106782122 A | 5/2017 | |
| CN | 107180594 A | 9/2017 | |
| CN | 107331294 A | 11/2017 | |
| CN | 107422509 A | 12/2017 | |
| CN | 108037627 A | 5/2018 | |
| CN | 108598142 A | 9/2018 | |
| KR | 20070020608 A | * 2/2007 | ........... G09G 3/3648 |

* cited by examiner

DISPLAY PANEL AND DISPLAY

TECHNICAL FIELD

The present disclosure relates to a display technical field, and more particularly, to a display panel and a display.

BACKGROUND ART

With the development of the related technology, in order to improve impression experience of a user, reducing an occupation space of a non-display region to improve a screen occupation ratio of a display panel is an important task in the production of the display panel in the industry. Referring to a structure view of a display panel in the prior art as shown in FIG. 1, in the prior display panel, the following design is generally used: the display panel generally includes a substrate 4, a plurality of insulating layers 5 disposed on the substrate 4, and a plurality of metal routings 6, and a display region 40 and a non-display region outside the display region 40 are formed.

In conjunction with the prior display panel as shown in FIG. 2, it can be obtained from an illustrative wiring mode in a first non-display region 50 positioned at both left and right sides of the display region 40 that a plurality of metal routings 6 in the first non-display region 50 are usually disposed on the same one of the insulating layers 5, a certain interval needs to be maintained between adjacent metal routings 6 to prevent short circuit, and intervals between the metal routings 6 in the first non-display region 50 occupy a certain space. Such a routing structure is apparently disadvantageous to reduce an occupation space of the non-display region so as to improve the screen occupation ratio of the display panel.

SUMMARY

In light of this, an objection of the present disclosure lies in providing a display panel and a display to solve the above problem In order to achieve the above objection, the present disclosure adopts the following technical solutions.

A display panel includes a substrate, plurality of insulating layers disposed on the substrate, and a plurality of metal routings, and includes a display region and a first non-display region at left and right sides of the display region, the plurality of metal routings being at the first non-display region, the plurality of metal routings being insulated from each other, and at least adjacent two of the metal routings being positioned on different layers of the insulating layers.

Preferably, there is no interval between orthographic projections of the at least adjacent two of the metal routings on the substrate.

Preferably, the plurality of insulating layers include an interlayer buffer layer, a first inorganic insulating layer and a second inorganic insulating layer sequentially disposed on the substrate.

Preferably, the plurality of metal routings include a plurality of GOA signal lines.

Preferably, the plurality of GOA signal lines include: a gate-on voltage line disposed on the interlayer buffer layer; a gate-off voltage line disposed on the first inorganic insulating layer; and a first clock signal line and a second clock signal line disposed on the second inorganic insulating layer.

Preferably, the first non-display region further includes a GOA drive circuit to which the plurality of GOA signal lines are connected.

Preferably, the plurality of metal routings include a plurality of test lines.

Preferably, the plurality of test lines include: a first data signal test line and a first GOA signal test line disposed on the interlayer buffer layer; a second data signal test line, a second GOA signal test line and a third GOA signal test line disposed on the first inorganic insulating layer; and an enable signal test line disposed on the second inorganic insulating layer.

Preferably, the display panel further includes a second non-display region positioned at a lower side of the display region, the second non-display region including a first routing, a fan-out routing, a fan-out insulating layer and a power supply line, the first routing being disposed on the substrate, the fan-out insulating layer being disposed on the first routing and the substrate, the first routing being connected with the second routing of the display region, and the power supply line being disposed on the fan-out insulating layer, wherein the first routing penetrates the fan-out insulating layer to be connected to the fan-out routing on the fan-out insulating layer, and the fan-out routing is disposed on the same layer with the power supply line.

Preferably, the second non-display region further includes a source drive circuit, the power supply line is disposed between the source drive circuit and the display region, the fan-out routing is disposed between the source drive circuit and the power supply line, and the power supply line and the fan-out routing are connected to the source drive circuit, respectively.

Or, the plurality of insulating layers include an interlayer buffer layer, a first inorganic insulating layer and a second inorganic insulating layer sequentially disposed on the substrate.

Or, the plurality of metal routings include a plurality of GOA signal lines.

Or, the plurality of GOA signal lines include: a gate-on voltage line disposed on the interlayer buffer layer; a gate-off voltage line disposed on the first inorganic insulating layer; and a first clock signal line and a second clock signal line disposed on the second inorganic insulating layer.

Or, the first non-display region further includes a GOA drive circuit to which the plurality of GOA signal lines are connected.

Or, the plurality of metal routings include a plurality of test lines.

Or, the plurality of test lines include: a first data signal test line and a first GOA signal test line disposed on the interlayer buffer layer; a second data signal test line, a second GOA signal test line and a third GOA signal test line disposed on the first inorganic insulating layer; and an enable signal test line disposed on the second inorganic insulating layer.

Or, the display panel further includes a second non-display region positioned at a lower side of the display region, the second non-display region including a first routing, a fan-out routing, a fan-out insulating layer and a power supply line, the first routing being disposed on the substrate, the fan-out insulating layer being disposed on the first routing and the substrate, the first routing being connected with the second routing of the display region, and the power supply line being disposed on the fan-out insulating layer, wherein the first routing penetrates the fan-out insulating layer to be connected to the fan-out routing on the fan-out insulating layer, and the fan-out routing is disposed on the same layer the power supply line.

Or, the second non-display region further includes a source drive circuit, the power supply line is disposed between the source drive circuit and the display region, the fan-out routing is disposed between the source drive circuit and the power supply line and the power supply line and the fan-out routing are connected to the source drive circuit, respectively.

The present disclosure further provides a display including the display panel described as above.

The display panel and the display provided by the present disclosure can, on one hand, reduce a space occupied by the first non-display region by disposing a plurality of metal routings of the first non-display region on different layers of the insulating layers so that there is no need to consider an interval in the horizontal direction between the metal routings which are not located on the same insulating layer; and on the other hand, the display panel can be bent directly package by the fan-out routing following the substrate so as to implement a COP package, and thus reduces a space occupied by the second non-display region at a lower side of the display region. Accordingly, the display panel can reduce a space occupied by the non-display region and effectively improve a screen occupation ratio through the above manner.

DETAILED DESCRIPTION OF EXEMPLARY EMBODIMENTS

Figure 1:
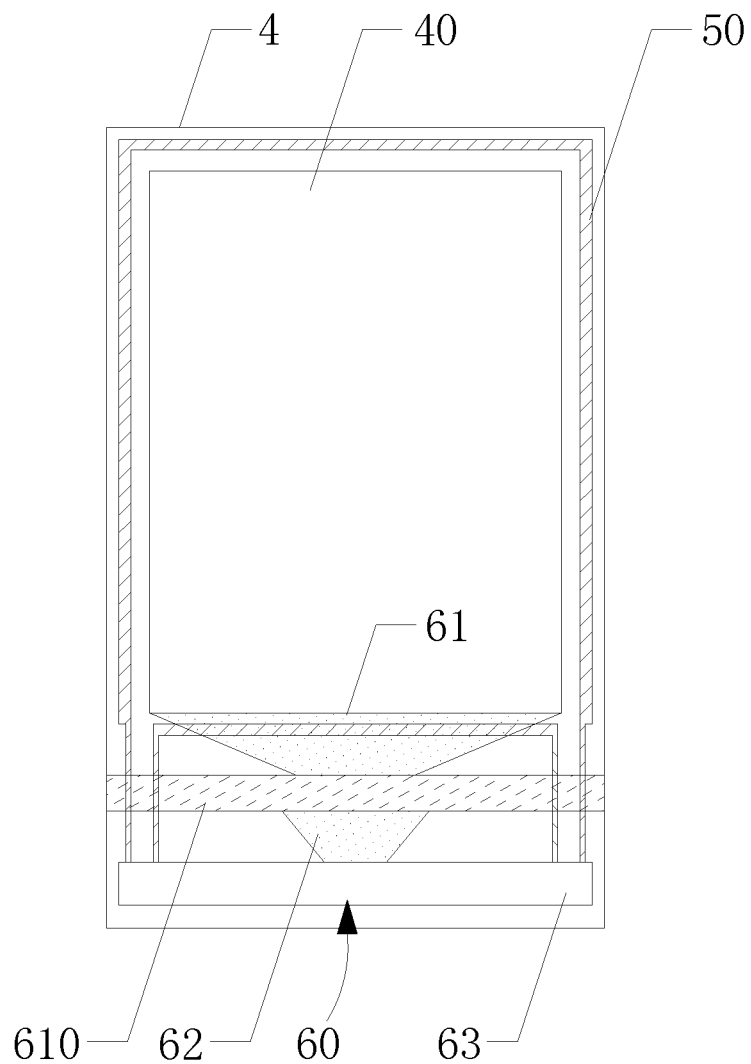
FIG. 1 is a structural schematic view of a display panel in the prior art.
Figure 2:
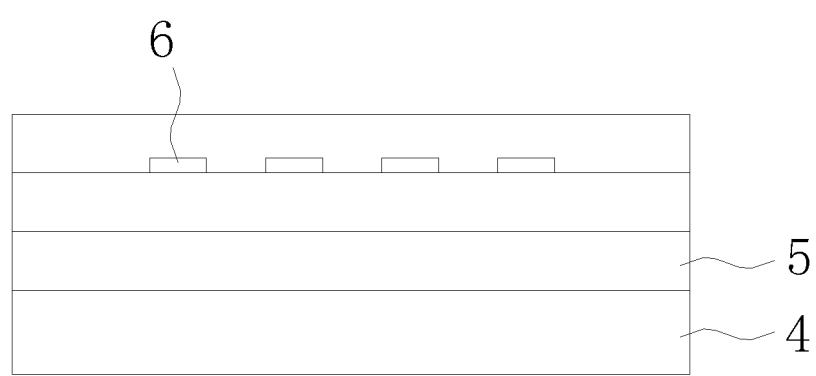
FIG. 2 is a wiring view of a first non-display region of the display panel in the prior art.

In order to make the purpose, technical solutions and advantages of the present disclosure to be clearer, the detailed description of exemplary embodiments of the present disclosure will be explained below in conjunction with the drawings. Examples of these preferred implementations are illustrated in the drawings. The implementations of the present disclosure illustrated in the drawings and described according to the drawings are only exemplary, and the present disclosure is not limited to these implementations.

Here, it is also worthy explaining that, in order to prevent the present disclosure from being obscured due to unnecessary details, structures and/or processing steps closely related to the solution based on the present disclosure are only illustrated in the drawings, while other details less related to the present disclosure are omitted.

Embodiment 1

Figure 3:
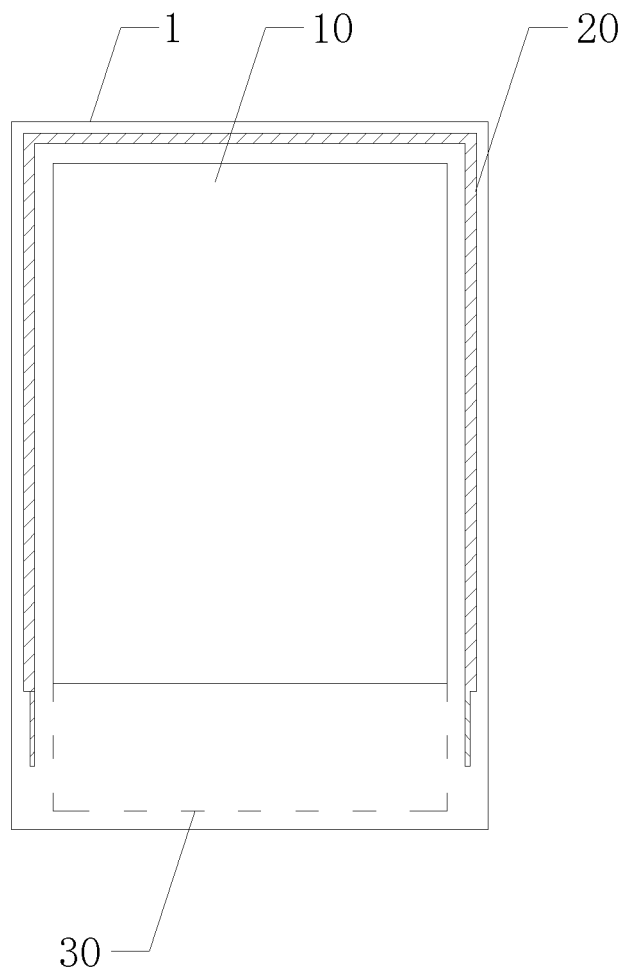
FIG. 3 is a structural schematic view of a display panel provided in Embodiment 1 of the present disclosure.
Figure 4:
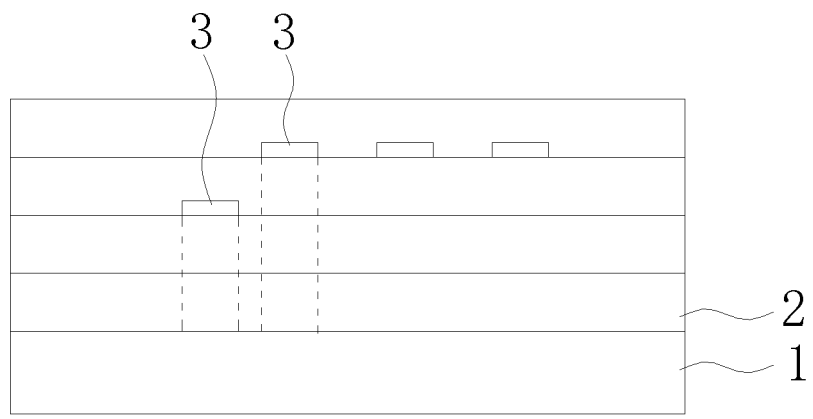
FIG. 4 is a corresponding structural schematic view of one implementation of a first non-display region in Embodiment 1 of the present disclosure.
Figure 5:
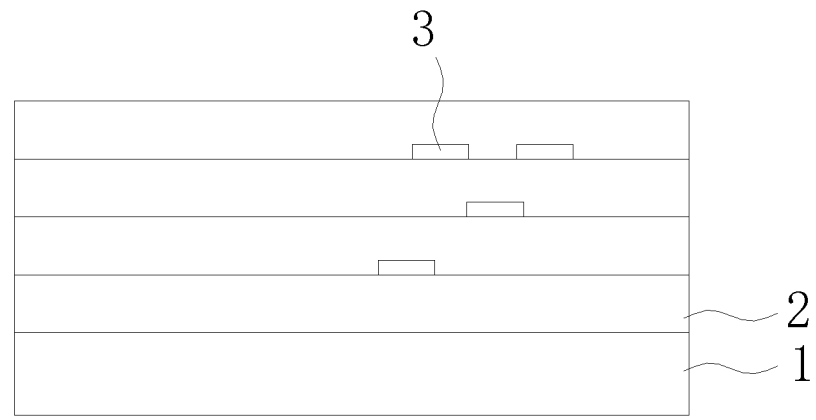
FIG. 5 is a corresponding structural schematic view of another implementation of a first non-display region in Embodiment 1 of the present disclosure.

As shown in FIG. 3, the present disclosure provides a display panel including a substrate 1, a plurality of insulating layer 2 laminatedly disposed on the substrate 1, and a plurality of metal routings 3, the display panel including a display region 10 and a first non-display region 20 at both left and right sides of the display region 10.

Wherein combined with illustration of FIGS. 4 and 5 (the dotted lines in the drawing represent orthographic projection directions of two of the metal routings 3 on the substrate 1, and an interval between the dotted lines extended on the same metal routing 3 represents a line width of the metal routing 3), the plurality of metal routings 3 are positioned in the first non-display region 20, the plurality of metal routings 3 are mutually insulated from each other, and at least adjacent two of the metal routings 3 are positioned on different layers of the insulating layers 2.

At least adjacent two of the metal routings 3 are disposed on different layers of the insulating layers 2, respectively, in the first non-display region 20 of the display panel, so that it is unnecessary to consider a short-circuit problem when the metal routings 3 which are not on the same insulating layer 2 are disposed on the same layer, and an interval size between these metal routings 3 in a horizontal direction in parallel with respective insulating layers 2 may be reduced, thereby reducing a space occupied by the first non-display region 20 in the horizontal direction, and thus a bezel of the display panel may be designed to be narrower so as to be advantageous to improve a screen occupation ratio of the display panel. As shown in FIG. 4, as one implementation of the first non-display region 20, when two adjacent metal routings 3 are positioned on different layers of the insulating layers 2, the two metal routings 3 may be disposed to be closer to one another than other adjacent metal routings 3 do, so that a length of the first non-display region 20 in the horizontal direction corresponding to an interval variation value of the two metal routings 3 may be reduced. In the prior art, a line width of a general metal routing is about 2.8 μm, and an interval between two adjacent metal routings disposed on a same insulating layer is about more than 3 μm, while by adopting the above disposing of the embodiment of the present disclosure, an interval between the two adjacent metal routings 3 positioned on different layers of the insulating layers 2 may be reduced to be 0.6 μm and less, such that a bezel width of the display panel can be effectively reduced.

The present embodiment may be further disposed to have no interval between orthographic projections of at least adjacent two of the metal routings 3 on the substrate 1, that is, the interval between the adjacent two of the metal routings 3 in the horizontal direction is zero, and orthographic projections of the adjacent two of the metal routings 3 on the substrate 1 may even overlap with one another, so that the length of the first non-display region 20 in the horizontal direction may be further reduced.

Of course, in the first non-display region 20, more of the metal routings 3 can also be disposed such that two adjacent of the metal routings 3 are positioned on different layers of the insulating layers 2, such as another implementation of the first non-display region 20 that FIG. 5 corresponds to, in which, any adjacent two of the metal routings 3 may be disposed to be closer to one another than adjacent ones of the metal routings 3 at the same layer do.

In addition, in the prior art, metal routings on a same layer need to be connected to a drive circuit by using different wires in different through-holes in order to avoid occurrence of short circuit. This wiring manner not only results in a space occupation problem but also increases impedance of a drive signal being transmitted to the drive circuit. However, according to the wiring manner of the display panel provided in the present disclosure, a part of metal routings 3 may be enabled to be directly connected to a drive circuit during wiring without using different wires in different through-holes, and transmission impedance is reduced.

Further, orthographic projections of the plurality of metal routings 3 on the substrate 1 may be disposed to form a complete projection plane, that is, all of adjacent metal routings 3 have no interval in the horizontal direction in the first non-display region 20.

Figure 6:
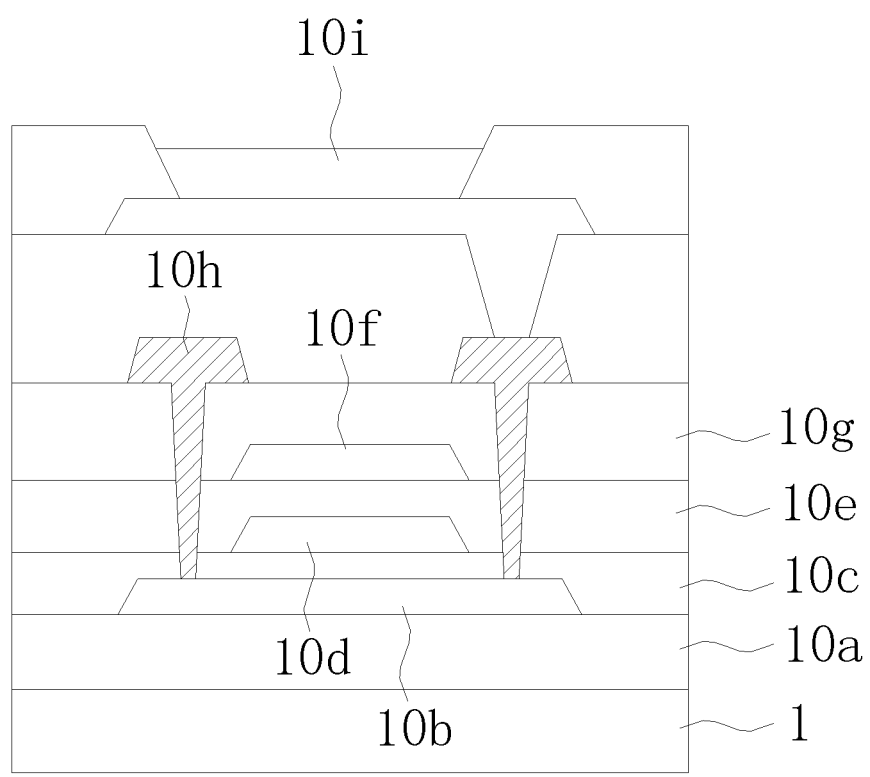
FIG. 6 is a structural schematic view of a display region in Embodiment 1 of the present disclosure.

As shown in FIG. 6, in the present embodiment, the display region 10 includes a buffer layer 10a, an active layer 10b, a first insulating layer 10c, a gate metal layer 10d, a second insulating layer 10e, a capacitance electrode metal layer 10f, a third insulating layer 10g, a source/drain metal layer 10h contacting the active layer 10b through the third insulating layer 10g, the second insulating layer 10e and the first insulating layer 10c, and an organic light emitting layer 10i, which are sequentially disposed on the substrate 1. Since a capacitance electrode of a storage capacitor of the display panel may be shared with a gate electrode of a transistor, the above gate metal layer 10d may be used as both the gate electrode of the transistor and the capacitance electrode. Thus, the gate metal layer 10d and the capacitance electrode metal layer 10f are made of the same material.

Figure 7:
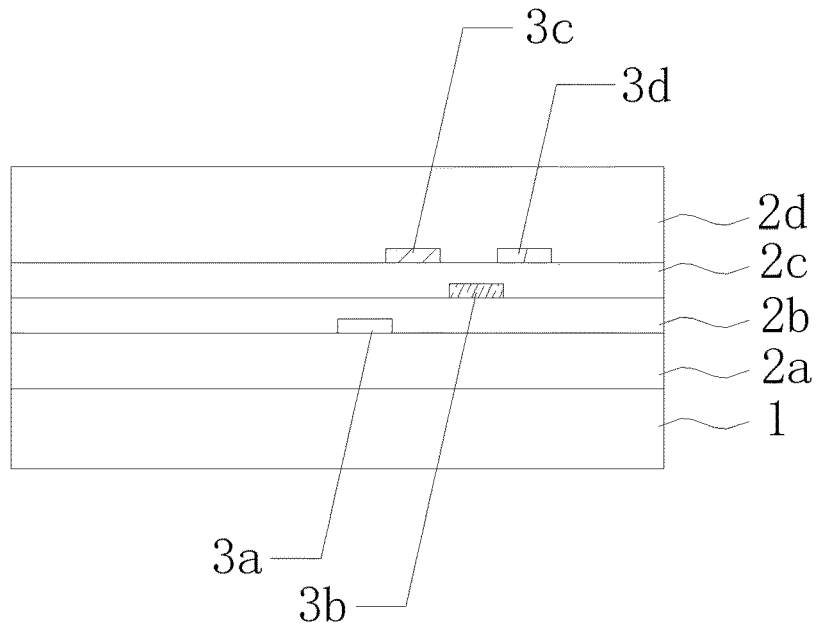
FIG. 7 is a wiring view of GOA signal lines in a first non-display region in Embodiment 1 of the present disclosure.
Figure 8:
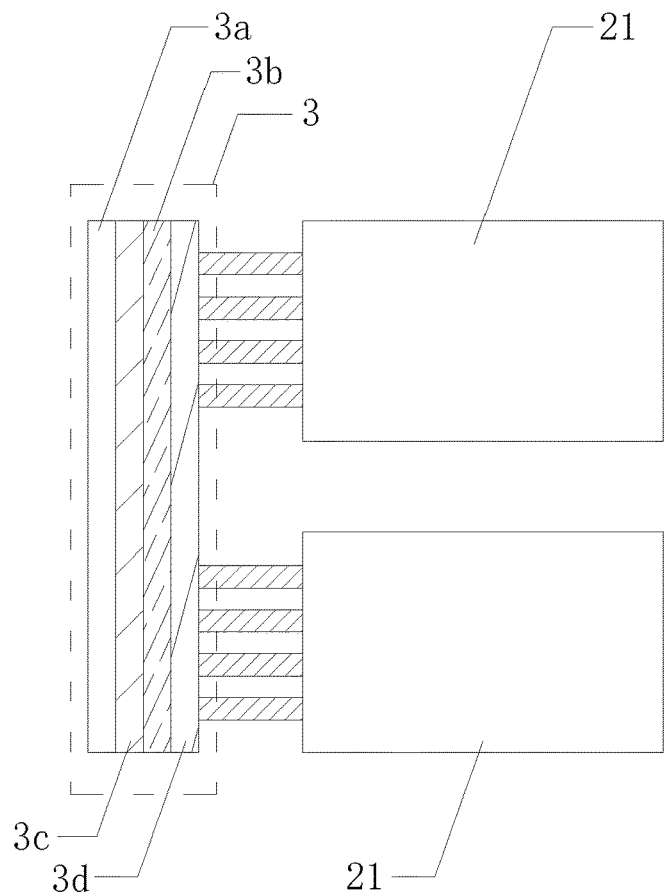
FIG. 8 is a connection schematic view of GOA signal lines and a GOA drive circuit in Embodiment 1 of the present disclosure.

Combined with illustrations of FIGS. 6-8, in the present embodiment, the plurality of insulating layers 2 include an interlayer buffer layer 2a, a first inorganic insulating layer 2b, a second inorganic insulating layer 2c and an organic layer 2d sequentially disposed on the substrate. In the structure of the first non-display region 20 corresponding to the display region 10, the interlayer buffer layer 2a is in the same layer structure with the buffer layer 10a of the display region 10, the first inorganic insulating layer 2b is in the same layer structure with the first insulating layer 10e of the display region 10, the second inorganic insulating layer 2c is in the same layer structure with the second insulating layer 10f of the display region 10, and the organic layer 2d is in the same layer structure with the organic light emitting layer 10i. The plurality of metal routings 3 may be selectively disposed to be gate layer routings formed simultaneously with the gate metal layer 10d, capacitance electrode layer routings formed simultaneously with the capacitance electrode metal layer 10f, or source/drain layer routings formed simultaneously with the source/drain metal layer 10h, respectively. Similarly, the gate layer routing and the capacitance electrode layer routing are made of the same material, for example, made of metal molybdenum.

Illustratively, the plurality of metal routings 3 include a plurality of GOA (Gate Driver On Array) signal lines.

Specifically, the plurality of GOA signal lines include: a gate-on voltage line (VGH) 3a disposed on the interlayer buffer layer 2a; a gate-off voltage line (VGL) 3b disposed on the first inorganic insulating layer 2b; and a first clock signal line (CK) 3c and a second clock signal line (XCK) 3d disposed on the second inorganic insulating layer 2c. The gate-on voltage line 3a is simultaneously formed with the gate metal layer 10d on the display region 10, the gate-off voltage line 3b is simultaneously formed with the capacitance electrode metal layer 10f on the display region 10, and the first clock signal line 3c and the second clock signal line 3d are simultaneously formed with the source/drain metal layer 10h on the display region 10.

Furthermore, the first non-display region 20 further includes a GOA drive circuit 21 to which the plurality of GOA signal lines are connected.

Illustratively, the plurality of metal routings 3 include a plurality of test lines.

Figure 9:
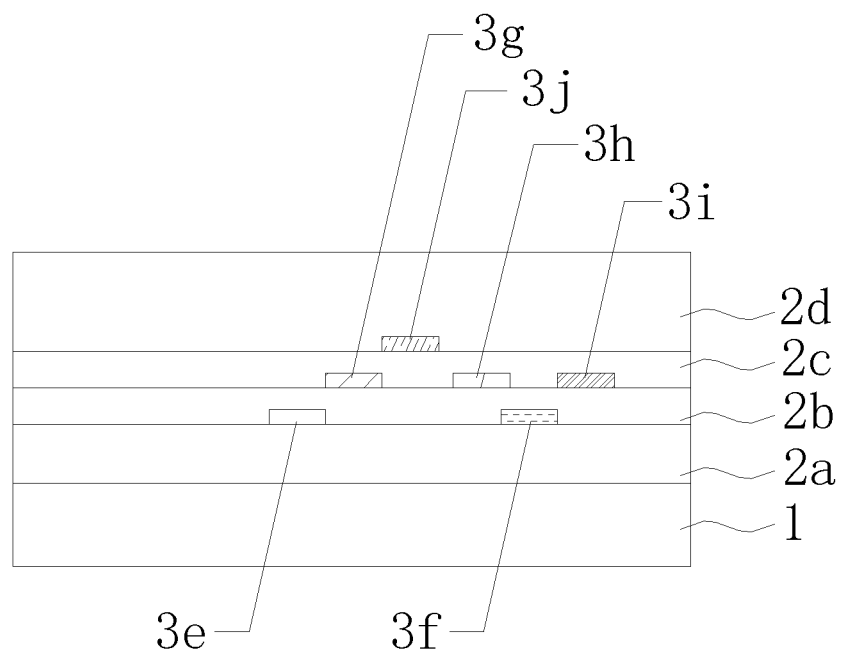
FIG. 9 is a wiring view of test lines in a first non-display region in Embodiment 1 of the present disclosure.

Specifically, combined with illustration of FIG. 9, the plurality of test lines include: a first data signal test line (Data1) 3e and a first GOA signal test line (Test1) 3f disposed on the interlayer buffer layer 2a; a second data signal test line (Data2) 3g, a second GOA signal test line (Test 2) 3h and a third GOA signal test line (Test3) 3i disposed on the first inorganic insulating layer 2b; and an enable signal test line (EN) 3j disposed on the second inorganic insulating layer 2c. The first data signal test line 3e and the first GOA signal test line 3f are formed simultaneously with the gate metal layer 10d on the display region 10, the second data signal test line 3g, the second GOA signal test line 3h and the third GOA signal test line 3i are formed simultaneously with the capacitance electrode metal layer 10f on the display region 10, and the enable signal test line 3j is formed simultaneously with the source/drain metal layer 10h on the display region 10. Since the gate metal layer 10d and the capacitance electrode metal layer 10f are made of the same material, the materials of their corresponding test lines are identical, thereby preventing signal transmission from being affected due to different resistivities. Wherein the first GOA signal test line 3f, the second GOA signal test line 3h and the third GOA signal test line 3i as above may be disposed to be test lines of an output signal of the last stage of the GOA drive circuit.

Embodiment 2

Figure 10:
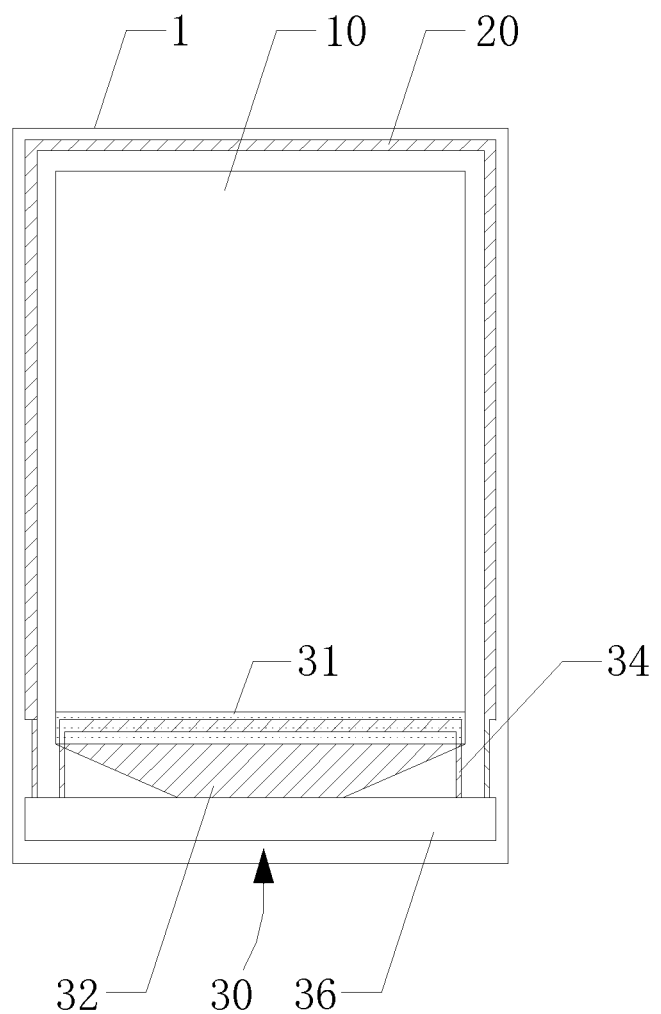
FIG. 10 is a structural schematic view of a display panel provided in Embodiment 2 of the present disclosure.
Figure 11:
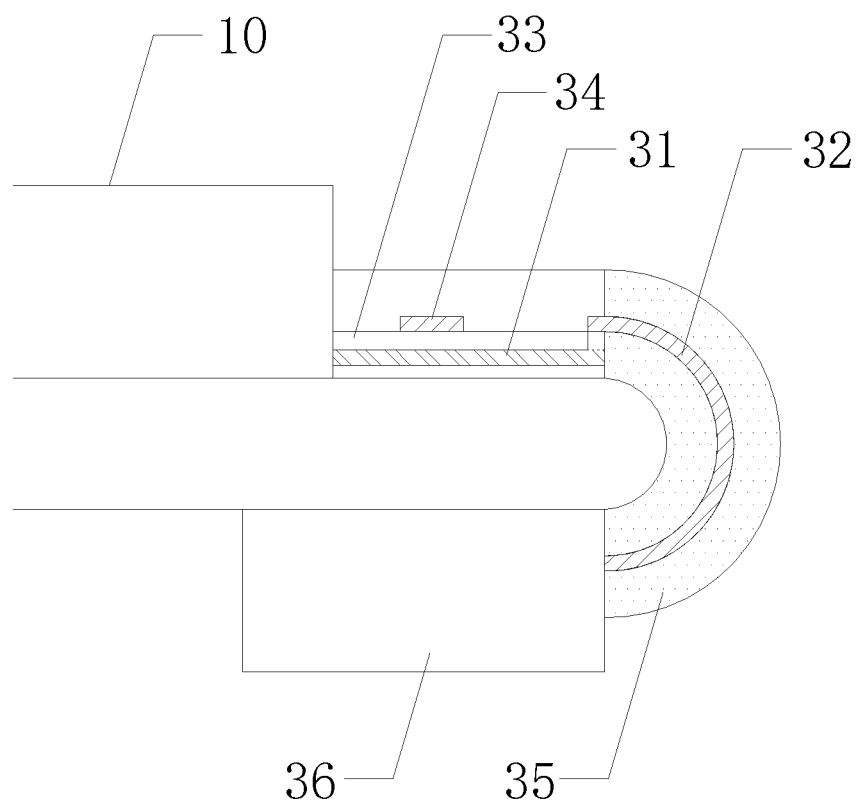
FIG. 11 is a structural schematic view of a second non-display region in Embodiment 2 of the present disclosure.

By referring to illustrations of FIGS. 10 and 11, the present embodiment is based on the display panel provided by Embodiment 1, and furthermore, the display panel further includes a second non-display region 30 positioned at a lower side of the display region 10, which includes a first routing 31, a fan-out routing 32, a fan-out insulating layer 33 and a power supply line 34. The first routing 31 is disposed on the substrate 1, the fan-out insulating layer 33 is disposed on the first routing 31 and the substrate 1, and the first routing 31 is connected with the second routing of the display region 10, and the power supply line 34 is disposed on the fan-out insulating layer 33.

The first routing 31 penetrates the fan-out insulating layer 33 to be connected to the fan-out routing 32 positioned on the fan-out insulating layer 33, and the fan-out routing 32 is disposed to be on the same layer with the power supply line 34.

The first routing 31 of the present embodiment may be disposed as a gate layer metal routing formed simultaneously with the gate metal layer 10d, and the second routing, the fan-out routing 32 and the power supply line 34 of the above display region are source/drain layer metal routings formed simultaneously with the source/drain metal layer 10h.

Combined with illustrations of FIGS. 1 and 11, the display panel in the prior art generally further includes a second non-display region 60, in which two fan-out routing regions need to be disposed to connect a second routing of the display region 10 and a source drive unit 63 so as to be bent through a connection region 610 between a first fan-out region 61 and a second fan-out region 62, so that the second fan-out region 62 is turned over beneath the display region 40 together with the source drive unit 63. The second non-display region 60 needs to provide two fan-out routing regions and a space occupied by the connection region 610, thereby limiting a length of the display panel. However, in the display panel of the present embodiment, by replacing the first fan-out region 61 with the first routing 31, the second routing positioned on the source/drain metal layer 10h in the display region 10 penetrates the fan-out insulating layer 33 to be connected to one end of the first routing 31 positioned below the power supply line 34 and the fan-out insulating layer 33 by using different wires in different through-holes, and the other end of the first routing 31 penetrates the fan-out insulating layer 33 to be connected to the fan-out routing 32 which is the source/drain layer metal routing along with the power supply line 34, that is, to be connected to the fan-out routing 32 on the same layer with the power supply line 34, by using different wires in different through-holes. Since the fan-out routing 32 and the power supply line 34 are the source/drain layer metal routings, and both of them are located in a neutral plane of the second non-display region 30, so that the fan-out routing 32 can be bent following the substrate 1 by subjecting to a lower stress, thereby implementing a COP (Chip On Plastic, in which a chip is mounted on a flexible substrate) package. Thus, compared with the prior art, the display panel can be directly bent with the fan-out routing 32, thereby saving the space of the second non-display region 30, so that the length of the display panel can be reduced therewith, and thus, a ratio of the space occupied by the display region 10 is further improved and the screen occupation ratio is improved.

In the present embodiment, routings having an excellent bending performance are required to be selected as the fan-out routing 32, and an organic insulating layer 35 is formed by removing the inorganic material of the region where the fan-out routing 32 is formed, filling organic materials therein and overlaying inorganic materials over the fan-out routing 32, so that the fan-out routing 32 approaches the neutral plane of the second non-display region 30.

In the present embodiment, the second non-display region 30 is disposed with the source drive circuit 36, the power supply line 34 is disposed between the source drive circuit 36 and the display region 10, the fan-out routing 32 is disposed between the source drive circuit 36 and the power supply line 34, and the power supply line 34 and the fan-out routing 32 are connected to the source drive circuit 36, respectively.

The present disclosure further provides a display including the display panel described as above.

In summary, the display panel and the display provided by the present disclosure can reduce the space occupied by the first non-display region 20 by disposing a plurality of metal routings 3 of the first non-display region 20 on different layers of the insulating layers 2 so that there is no need to consider an interval in the horizontal direction between the metal routings 3 which are not on the same insulating layer 2; moreover, the display panel can be directly bent with the fan-out routing 32 following the substrate 1 to implement the COP package, so as to reduce the space occupied by the second non-display region 30, and accordingly, through the above manner, the display panel and the display can reduce the space occupied by the non-display region and effectively improve the screen occupation ratio.

It needs to be explained that the relationship terms, such as first, second, etc., in the present disclosure are only used for distinguishing one entity or operation from another entity or operation without requiring or implying any actual relation or sequence existing between these entities or operations. Moreover, the term "include", "including", "comprise", "comprising" or any other variant means covering instead of exclusively including, so that a process, method, object or device including a series of elements not only includes those elements but also includes other elements that are not explicitly listed, or further includes inherent factors for this process, method, object or device. Where no more limitations are provided, the elements defined by a sentence "include/including a/one . . . " do not exclude additional identical elements existing in the process, method, object or device which includes the elements.

The above statements are only the specific embodiments of the present application, and it should be pointed out that, to those ordinary skilled in the art, several improvements and modifications can also be made without departing from the principle of the present application, and should be considered as the protection scope of the present application.

What is claimed is:

1. A display panel, comprising:
    a substrate;
    a plurality of insulating layers disposed on the substrate; and
    a plurality of metal routings disposed on the plurality of insulating layers, the display panel comprising a display region and a first non-display region at left and right sides of the display region, wherein:
    the plurality of metal routings are positioned at the first non-display region and are insulated from each other,
    the plurality of metal routings comprise a plurality of GOA signal lines, comprising a first clock signal line, a second clock signal line, a gate-on voltage line, and a gate-off voltage line,
    at least adjacent two of the metal routings are positioned on different layers of the plurality of insulating layers;
    wherein the plurality of insulating layers comprise an interlayer buffer layer, a first inorganic insulating layer and a second inorganic insulating layer sequentially disposed on the substrate,
    the gate-on voltage line is disposed on the interlayer buffer layer;
    the gate-off voltage line is disposed on the first inorganic insulating layer; and
    the first clock signal line and the second clock signal line are disposed on the second inorganic insulating layer.

2. The display panel of claim 1, wherein there is no interval between orthographic projections of the at least adjacent two of the metal routings on the substrate.

3. The display panel of claim 1, wherein the first non-display region further comprises a GOA drive circuit to which the plurality of GOA signal lines are connected.

4. The display panel of claim 1, wherein the plurality of metal routings comprise a plurality of test lines.

5. The display panel of claim 4, wherein the plurality of test lines comprise:
    a first data signal test line and a first GOA signal test line disposed on the interlayer buffer layer;
    a second data signal test line, a second GOA signal test line and a third GOA signal test line disposed on the first inorganic insulating layer; and
    an enable signal test line disposed on the second inorganic insulating layer.

6. The display panel of claim 1, wherein the display panel further comprises a second non-display region positioned at a lower side of the display region, the second non-display region comprises a first routing, a fan-out routing, a fan-out insulating layer, and a power supply line, the first routing being disposed on the substrate, the fan out insulating layer being disposed on the first routing and the substrate, the first routing being connected with the second routing of the display region, and the power supply line being disposed on the fan-out insulating layer, wherein the first routing penetrates the fan-out insulating layer to be connected to the fan-out routing on the fan-out insulating layer, and the fan-out routing is disposed on the same layer with the power supply line.

7. The display panel of claim 6, wherein the second non-display region further comprises a source drive circuit, the power supply line is disposed between the source drive circuit and the display region, the fan-out routing is disposed between the source drive circuit and the power supply line, and the power supply line and the fan-out routing are connected to the source drive circuit, respectively.

8. The display panel of claim 2, wherein the first non-display region further comprises a GOA drive circuit to which the plurality of GOA signal lines are connected.

9. The display panel of claim 2, wherein the plurality of metal routings comprise a plurality of test lines.

10. The display panel of claim 9, wherein the plurality of test lines comprise:
a first data signal test line and a first GOA signal test line disposed on the interlayer buffer layer;
a second data signal test line, a second GOA signal test line and a third GOA signal test line disposed on the first inorganic insulating layer; and
an enable signal test line disposed on the second inorganic insulating layer.

11. The display panel of claim 2, wherein the display panel further comprises a second non-display region positioned at a lower side of the display region, the second non-display region comprises a first routing, a fan-out routing, a fan-out insulating layer and a power supply line, the first routing being disposed on the substrate, the fan out insulating layer being disposed on the first routing and the substrate, the first routing being connected with the second routing of the display region, and the power supply line being disposed on the fan-out insulating layer, wherein the first routing penetrates the fan-out insulating layer to be connected to the fan-out routing on the fan-out insulating layer, and the fan-out routing is disposed on the same layer with the power supply line.

12. The display panel of claim 11, wherein the second non-display region further comprises a source drive circuit, the power supply line is disposed between the source drive circuit and the display region, the fan-out routing is disposed between the source drive circuit and the power supply line, and the power supply line and the fan-out routing are connected to the source drive circuit, respectively.

13. A display device comprising a display panel, wherein the display panel comprises:
a substrate;
a plurality of insulating layers disposed on the substrate; and
a plurality of metal routings disposed on the plurality of insulating layers, the display panel comprising a display region and a first non-display region at left and right sides of the display region, wherein the plurality of metal routings are positioned at the first non-display region and are insulated from each other, the plurality of metal routings comprise a plurality of GOA signal lines, comprising a first clock signal line, a second clock signal line, a gate-on voltage line, and a gate-off voltage line, and at least adjacent two of the metal routings are positioned on different layers of the plurality of insulating layers;
wherein the plurality of insulating layers comprise an interlayer buffer layer, a first inorganic insulating layer and a second inorganic insulating layer sequentially disposed on the substrate,
the gate-on voltage line is disposed on the interlayer buffer layer;
the gate-off voltage line is disposed on the first inorganic insulating layer; and
the first clock signal line and the second clock signal line are disposed on the second inorganic insulating layer.

* * * * *